(12) United States Patent
Owen et al.

(10) Patent No.: US 9,116,187 B1
(45) Date of Patent: Aug. 25, 2015

(54) SYSTEM AND METHOD FOR MEASURING SIGNAL DISTORTION

(75) Inventors: Andrew M. Owen, Lake Villa, IL (US); Robert E. Shoulders, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 720 days.

(21) Appl. No.: 13/335,998

(22) Filed: Dec. 23, 2011

(51) Int. Cl.
*G01R 23/20* (2006.01)
*G01R 29/26* (2006.01)
*G01R 27/28* (2006.01)
*G01R 27/32* (2006.01)

(52) U.S. Cl.
CPC ............... *G01R 29/26* (2013.01); *G01R 27/28* (2013.01); *G01R 27/32* (2013.01)

(58) Field of Classification Search
CPC ........ G01R 23/20; G01R 29/26; G01R 27/28; G01R 27/32
USPC ................... 324/624, 620, 612, 613
See application file for complete search history.

(56) References Cited

U.S. PATENT DOCUMENTS

| | | | |
|---|---|---|---|
| 6,263,289 B1 | 7/2001 | Hassun et al. | |
| 6,567,762 B2 * | 5/2003 | Bourde et al. | 702/107 |
| 6,766,262 B2 * | 7/2004 | Martens | 702/69 |
| 8,483,313 B2 * | 7/2013 | Yonge et al. | 375/296 |
| 2001/0033238 A1 * | 10/2001 | Velazquez | 341/118 |
| 2010/0039174 A1 | 2/2010 | Teetzel | |
| 2011/0195673 A1 | 8/2011 | Pratt et al. | |

* cited by examiner

*Primary Examiner* — Amy He

(57) ABSTRACT

A system has an extended dynamic range for measuring distortion in an output signal of a device under test (DUT), the output signal having at least a first fundamental signal. The system includes a first combiner and a test receiver. The first combiner is configured to inject a first cancellation signal generated by a first signal source into the output signal from the DUT, at least one of a first magnitude and a first phase of the first cancellation signal being adjustable for suppressing the first fundamental signal. The test receiver is configured to receive and measure the output signal having the suppressed first fundamental signal.

17 Claims, 6 Drawing Sheets

SYSTEM AND METHOD FOR MEASURING SIGNAL DISTORTION

BACKGROUND

Distortion properties of an electronic device or device under test (DUT) may be characterized by various means, including measurement of intermodulation distortion (IMD) products in signals output by the DUT. Measurement of IMD products and other distortion properties require a linear receiver with a wide dynamic range (e.g., the ability to measure large signals and small signals simultaneously and accurately). That is, the receiver should not produce internally-generated distortion, which may mask the distortion properties of the DUT.

Conventionally, in order to minimize distortion, the signals received from the DUT are attenuated to prevent overdriving the receiver. While enabling large signals to be measured more effectively, such signal attenuation generally degrades the noise figure of the receiver, masking small distortion products in the receiver's noise floor. Adding a low-noise amplifier (LNA) to the receiver may decrease the noise figure, but the LNA also generates additional distortion.

Attempts improve the dynamic range of the receiver include selectively attenuating the large signals from the DUT, while passing small distortion products that are to be measured. For example, a filter is placed at the receiver input, such that the filter's amplitude variations over frequency may be compensated for as part of a calibration procedure which may yield accurate amplitude measurements. However, since the frequency response of the filter is fixed, multiple filters are needed to measure signals from the DUT over a range of frequencies. This is common practice when measuring IMD products of electronic switches, which can be −130 dB below the fundamental tones, for example. Using multiple filters is labor-intensive, particularly when testing multiple bands, and the calibration procedure is prone to error due to the number of components involved.

In another example, the stimulus (input) signal to the DUT is sampled, changed in amplitude and phase, and then added destructively with the output of the DUT where it is received by test equipment, as described for example by Hassun et al. in U.S. Pat. No. 6,263,289, which is hereby incorporated by reference. However, this technique requires analog phase shifters, attenuators and lines with line stretchers that must be manually adjusted. Also, the phase-delay of the cancellation path is physically large for some DUTs and/or frequencies, and resolution of step attenuators is limited to several tenths of a decibel (dB).

SUMMARY

In a representative embodiment, a system has an extended dynamic range for measuring distortion in an output signal of a device under test (DUT), the output signal having at least a first fundamental signal. The system includes a first combiner and a test receiver. The first combiner is configured to inject a first cancellation signal generated by a first signal source into the output signal from the DUT, at least one of a first magnitude and a first phase of the first cancellation signal being adjustable for suppressing the first fundamental signal. The test receiver is configured to receive and measure the output signal having the suppressed first fundamental signal.

In another representative embodiment, a method is provided for determining intermodulation distortion (IMD) products of a DUT. The method includes receiving an output signal from the DUT, the output signal including first and second fundamental signals at corresponding first and second frequencies and at least one IMD product; measuring first and second magnitudes of the first and second fundamental signals in the output signal, respectively; generating a first cancellation signal at the first frequency, the first cancellation signal having a magnitude substantially equal to the first magnitude, and deconstructively adding the first cancellation signal and the first fundamental signal to suppress the first fundamental signal in the output signal; generating a second cancellation signal at the second frequency, the second cancellation signal having a magnitude substantially equal to the second magnitude, and deconstructively adding the second cancellation signal and the second fundamental signal to suppress the second fundamental signal in the output signal; and measuring the at least one IMD product in the output signal having the suppressed first and second fundamental signals.

In another representative embodiment, a computer readable medium storing code, executable by a processor, is provided for linearizing a receiver. The computer readable medium includes fundamental signal measuring code for measuring a magnitude and a phase of a fundamental signal in a signal; generating code for controlling generation of a cancellation signal to have a magnitude substantially the same as the measured magnitude of the fundamental signal and a phase about 180 degrees out of phase with the measured phase of the fundamental signal; and cancelling code for deconstructively adding the cancellation signal and the fundamental signal to suppress at least a portion of the fundamental signal of the signal. The signal having the suppressed fundamental signal is received by the receiver.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

According to various representative embodiments, the dynamic range of a receiver is extended by actively suppressing fundamental signals present at the receiver, thus lowering the total power at the receiver and indirectly cancelling receiver-generated distortion products, including receiver IMD products, when measuring a signal from a device under test (DUT). The process may be referred to as "receiver linearization." For example, one or more continuous wave (CW) or modulated cancelation signals may be injected into the receiver system to add deconstructively with corresponding fundamental signals in the DUT signal, thereby suppressing all or a portion of each of the fundamental signals, which may be referred to as "cancelling" or "nulling" the fundamental signals. Therefore, the power at the receiver and the receiver-generated distortion products are lowered, without using attenuators and/or delay lines, as in various conventional techniques. The cancellation signals may be generated by signal generators or unused signal sources inside a vector network analyzer (VNA). Fundamental signal cancellation results in use of much less receiver attenuation (and more gain), and lead to a lower receiver noise figure. This translates to faster measurements (less averaging) and more accurate measurements (less corrupted by noise), and increased sensitivity to measuring non-fundamental signals.

Figure 1:
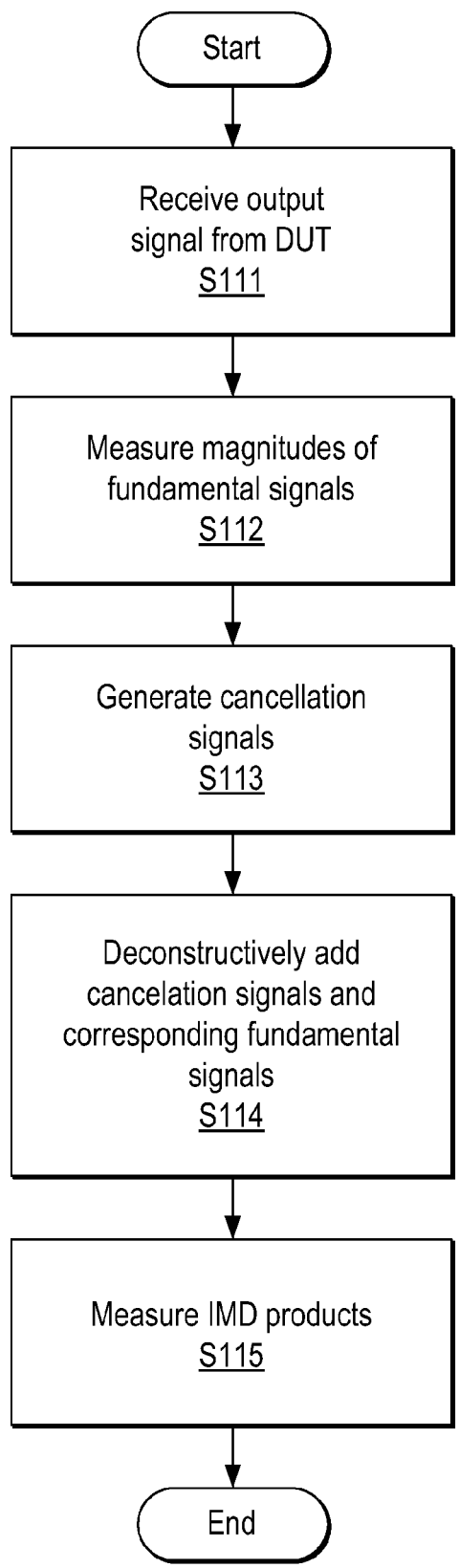
FIG. 1 is a flow diagram illustrating a method for measuring distortion properties of a device under test (DUT), according to a representative embodiment.

FIG. 1 is a flow diagram illustrating a method for measuring distortion properties at a receiver, such as intermodulation distortion (IMD) products, of a device under test (DUT), according to a representative embodiment.

The various operations depicted in FIG. 1 may be implemented in whole or in part by a processing device, such as processor 421 in representative controller 450, discussed below with reference to FIG. 4. The processing device may be included in a VNA or other measurement instrument, such as a spectrum analyzer or an oscilloscope, for example, or may be a separate device. In various alternative embodiments, the processing device may be implemented by a processor, application specific integrated circuits (ASICs), field-programmable gate arrays (FPGAs), or combinations thereof, using software, firmware, hard-wired logic circuits, or combinations thereof. When using a processor, a memory is included for storing executable software/firmware and/or executable code that allows it to perform the various functions.

Referring to FIG. 1, an output signal is received from a DUT in block S111. In the present example, the output signal includes first and second fundamental signals at corresponding first and second frequencies, as well as IMD products (and other distortion) resulting from the first and second fundamental signals. The first and second fundamental signals (one or both of which are to be suppressed) may be single frequency tones or more complex modulated signals, such as WCDMA signals or other communication signals and radar signals. The output signal of the DUT may be responsive to a corresponding stimulus (input) signal, where the output signal indicates the DUT's response to the stimulus signal. This is the case where the DUT is an amplifier, a switch, a filter, or the like, for example. Alternatively, the DUT may generate the output signal with no stimulus signal, for example, where the DUT is a transmitter, a signal generator, or the like. It is understood that the embodiments are not limited to output signals having two fundamental signals, as in the present example, and are thus applicable to output signals having more or fewer fundamental signals, as well. It is further understood that for output signals having multiple fundamental signals, various embodiments include suppressing fewer than all of the fundamental signals, as discussed below.

In block S112, first and second magnitudes (amplitudes) of the first and second fundamental signals in the output signal are measured, respectively. The first and second magnitudes may be measured by a first receiver, for example. The first and second frequencies may likewise be measured. In an embodiment, first and second phases of the first and second fundamental signals in the output signal may also be measured, respectively.

First and second cancellation signals are generated in step S113 in order to suppress the first and second fundamental signals, respectively. The first and second cancellation signals may also be referred to as "linearizing signals." More particularly, a first cancellation signal is generated at the first frequency, where the first cancellation signal has a magnitude substantially equal to the first magnitude of the first fundamental signal and a phase that differs by about 180 degrees from the phase of the first fundamental signal at the input of the receiver. A second cancellation signal is generated at the second frequency, where the second cancellation signal has a magnitude substantially equal to the second magnitude of the second fundamental signal and a phase that differs by about 180 degrees from the phase of the second fundamental signal at the input of the receiver.

The first and second cancellation signals may be provided by external signal generators ("linearizing sources"), for example. Alternatively, one or both of the first and second cancellation signals may be provided by internal sources of the VNA, for example. The number, type and location of the signal generators/sources may vary without departing from the scope of the present teachings. Also, the first and second cancellation signals may be measured by separate receivers (e.g., second and third receivers) or both the first and second cancellation signals may be measured by the same receiver, to assure that the corresponding frequencies and magnitudes match those of the first and second fundamental signals, and that the corresponding phases are opposite those of the first and second fundamental signals, respectively. In various embodiments, the second and third receivers provide feedback to the respective signal sources, so that the signal sources are able to adjust the frequencies, magnitudes and phases of the first and second cancellation signals, as needed. In various embodiments, the parameters of the first cancellation signal may be measured concurrently with measuring the first fundamental signal, and the parameters of the second cancellation signal may be measured concurrently with measuring the second fundamental signal, for example.

Generally, the first and second fundamental signals of the output signal received in block S111 may have certain properties. For example, each of the first and second fundamental signals can be represented by K1*X, where at any frequency, K1 is a complex constant and X is a signal incident on the DUT input. Also, each of the first and second cancelation signals can be represented by K2*X and generated by an independent source, where K2 has the property that at any frequency, it is a complex constant independent of X having magnitude and phase that can be set to values required to perform signal cancellation, where X is a signal incident on the DUT input. The first and second cancellation signals generated by the independent sources need to be generated substantially distortion free. That is, they are substantially free of signals that cannot be stated as K2*X, where X is a signal incident on the DUT input, since any distortion generated in the first and second cancellation signals would be attributed to the DUT. Stated differently, each linearizing source must be substantially free of distortion at the frequency being characterized. Generally, when cancelling CW signals in IMD measurements, it may be assumed that no third order intermodulation is being generated (since there is no mechanism for doing so), although this is not the case for modulated fundament signals.

In block S114, the first cancellation signal is deconstructively added to the first fundamental signal to suppress all or part of the first fundamental signal in the output signal, and the second cancellation signal is deconstructively added to the second fundamental signal to suppress all or part of the second fundamental signal in the output signal. Since the first cancellation signal is 180 degrees out of phase with the first fundamental signal, the adding operation may performed by a simple summing device or multiplexer in order to suppress the first fundamental signal. Likewise, since the second cancellation signal is 180 degrees out of phase with the second fundamental signal, the adding operation may performed by a simple summing device or multiplexer in order to suppress the second fundamental signal. Of course other deconstructive addition techniques may be incorporated, without departing from the present teachings. For example, techniques involving couplers, resistive combiners, op-amp summing circuits or difference circuits may be incorporated, particularly where such networks are internal to the VNA (e.g., a four-port VNA may contain as many as eight or nine couplers). Whatever the combining circuit, it needs to be sufficiently linear so as not to produce distortion.

As a result, the IMD products in the output signal are much closer in magnitude to the suppressed first and second fundamental signals. That is, the IMD products may have slightly lower, the same or even higher magnitudes than the suppressed first and second fundamental signals, depending on how much the first and second fundamental signals have been suppressed, but the IMD products to be measured are nonetheless unaltered. Accordingly, the IMD products in the output signal may be easily identified and measured in block S115 at a receiver. For example, each of the first and second fundamental signals levels may be suppressed by about 40 dB to about 60 dB from its initial magnitude value. This reduces the total power at the receiver, thus reducing receiver-generated IMD products. Accordingly, a lower receiver attenuation value may be used, improving the noise floor, such that it remains well below the IMD products in the output signal and therefore does not interfere with the measurements. Also, a wider intermediate frequency (IF) bandwidth may be used by the receiver, which speeds up the measurement, while maintaining the same sensitivity as was achieved with the original amount of attenuation. Due to the relatively small differences in magnitude among the IMD products and the first and second fundamental signals, the dynamic range of the receiver is effectively increased.

Figure 2:
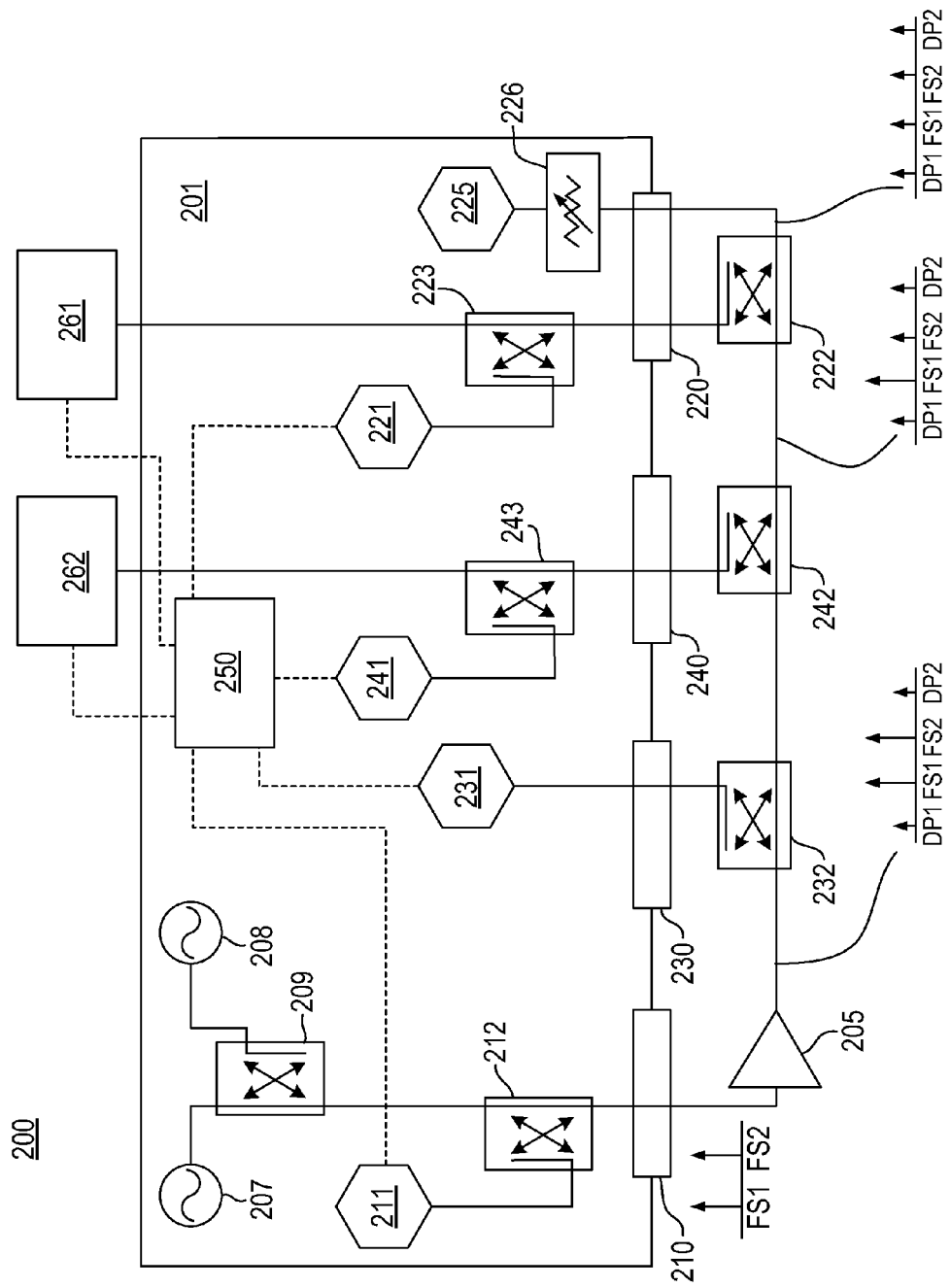
FIG. 2 is a block diagram illustrating a system for measuring distortion properties of a DUT, according to a representative embodiment.

FIG. 2 is a simplified block diagram illustrating a system for measuring distortion properties, such as IMD products, of a DUT, according to a representative embodiment.

Referring to FIG. 2, system 200 includes illustrative vector network analyzer (VNA) 201, which receives and processes an output signal from DUT 205, and first and second signal generators 261 and 262. The VNA 201 may be a PNA N522×A network analyzer or a PNA-X N524×A network analyzer, for example, available from Agilent Technologies, Inc., and each of the first and second signal generators 261 and 262 may be an MXG 518×A signal generator or a PSG E82×7D signal generator, for example, also available from Agilent Technologies, Inc. FIG. 2 depicts one illustrative implementation, and it is otherwise understood that the various components and functions may be implemented using any type of signal generator and/or measurement receiver, such as a spectrum analyzer, an oscilloscope, and the like.

In the depicted example, the VNA 201 also provides a stimulus signal to an input of the DUT 205, such that the output signal indicates the response of the DUT 205 to the stimulus signal. The stimulus signal includes a first fundamental signal at first frequency f1 and a second fundamental signal at second frequency f2, respectively indicated by vertical arrows FS1 and FS2. The output signal output by the DUT 205 in response to the stimulus signal likewise includes the first and second fundamental signals at the first and second frequencies f1 and f2, along with IMD products (and other distortion signals) introduced by the DUT 205, discussed below.

In the depicted embodiment, the stimulus signal is generated internally by the VNA 201. That is, the first fundamental signal is generated by first signal source 207 and the second fundamental signal is generated by second signal source 208. Of course, in alternative embodiments, one or both of the first and second signal sources 207 and 208 may be external signal generators located outside the VNA 201. The first and second fundamental signals are combined by combiner 209 to form the stimulus signal. The combiner 209 may be implemented as a directional coupler, for example. The stimulus signal is output from a first test port 210 of the VNA 201, to which the input of the DUT 205 is connected. The frequencies and/or magnitudes of the first and second fundamental signals may be measured by reference receiver 211 via coupler 212, which may be a directional coupler. The measurements are provided to controller 250, which may adjust the first and second signal sources 207 and 208, respectively, to the extent needed to provide the desired frequencies and magnitudes, as well as various other properties, of the first and second fundamental signals.

As indicated in FIG. 2, the stimulus signal may include two tones at the first and second frequencies f1 and f2 as the first and second fundamental signals. However, various other types of stimulus signals may be incorporated, without departing from the scope of the present teachings. For example, as mentioned above, the first and second fundamental signals may be more complex, such as WCDMA signals or other communication signals and radar signals. Alternatively, the stimulus signal may include only one fundamental signal, or more than two fundamental signals. Also as mentioned above, the DUT 205 may simply generate the output signal directly, e.g., without a corresponding stimulus signal. Further, the first and second fundamental signals are indicated as continuous wave (CW) signals provided by the first and second signal sources 207 and 208. However, pulse generators (not shown) may be included with one or both of the first and second signal sources 207 and 208, such that the first and second fundamental signals are pulsed signals.

In response to the stimulus signal, the DUT 205 provides the output signal, which includes the first and second fundamental signals, as well as IMD products (and other distortion), indicated by vertical arrows DP1 and DP2. The IMD products have magnitudes significantly smaller than the magnitudes of the first and second fundamental signals, as is indicated by the vertical arrows DP1 and DP2 in comparison with the vertical arrows FS1 and FS2.

Coupler 232 provides the output signal to test receiver 231 via a connection at third test port 230 of the VNA 201. The test receiver 231 measures the frequencies and/or magnitudes of the first and second fundamental signals. The test receiver 231 may also measure the phases of the first and second fundamental signals. The test receiver 231 may provide the measurements to the controller 250.

Meanwhile, the first and second signal generators 261 and 262 generate first and second cancellation signals, respectively. Each of the first and second signal generators may be referred to as a "linearizing" source. The first signal generator 261 is configured to generate the first cancellation signal at the first frequency f1, with a magnitude substantially equal to the magnitude of the first fundamental signal and a phase that differs by about 180 degrees from the phase of the first fundamental signal (as measured at the input of test receiver 225, where they must cancel, as discussed below). Similarly, the second signal generator 262 is configured to generate the second cancellation signal at the second frequency f2, with a magnitude substantially equal to the magnitude of the second fundamental signal and a phase that differs by about 180 degrees from the phase of the second fundamental signal. The frequency, magnitude and phase information may be communicated to the first and second signal generators 261 and 262 by the controller 250, for example. Or, the first and second signal generators 261 and 262 may be manually tuned. In the depicted embodiment, the first and second signal generators 261 and 262 are external signal sources, in that they are located outside the VNA 201. Of course, in alternative embodiments, one or both of the first and second signal generators 261 and 262 may be internal signal sources located within the VNA 201.

Coupler 243 provides the second cancellation signal to reference receiver 241, which measures the frequency, magnitude and/or phase of the second cancellation signal. The reference receiver 241 may provide the measurements to the controller 250, which may adjust the second signal generator 262 to the extent needed, so that the frequency of the second cancellation signal matches the second frequency f2, the first magnitude of the second cancellation signal matches the magnitude of the second fundamental signal, and the phase of the second cancellation signal differs by about 180 degrees from the phase of the second fundamental signal. The (adjusted) second cancellation signal is output from the VNA 201 via a connection at fourth test port 240 and combined with the output signal at coupler 242. By combining the second cancellation signal and the output signal in this manner, the second fundamental signal is effectively suppressed, as indicated by the shortened length of the vertical arrow FS2 in the output signal at the output of the coupler 242.

Notably, the magnitude and/or phase of the second cancellation signal may be adjusted to suppress the second fundamental signal completely, as discussed above, or only a portion of the second fundamental signal. For example, when the second cancellation signal and the second fundamental signal have the same magnitude and are 180 degrees out of phase with one another, the second fundamental signal is completely suppressed. However, when magnitude of the second cancellation signal is different than the magnitude of the second fundamental signal and/or the phase of the second cancellation signal is different than 180 degrees out of phase with the second fundamental signal, then the second fundamental signal is only partially suppressed. Of course, in various embodiments, the level of cancellation may be adjusted as desired.

Similarly, coupler 223 provides the first cancellation signal to reference receiver 221, which measures the frequency, magnitude and/or phase of the first cancellation signal. The reference receiver 221 may provide the measurements to the controller 250, which may adjust the first signal generator 261 to the extent needed, so that the frequency of the first cancellation signal matches the first frequency f1, the magnitude of the first cancellation signal matches the magnitude of the first fundamental signal, and the phase of the first cancellation signal differs by about 180 degrees from the phase of the first fundamental signal. The (adjusted) first cancellation signal is output from the VNA 201 via a connection at second test port 220 and combined with the output signal at coupler 222. By combining the first cancellation signal and the output signal in this manner, the first fundamental signal is suppressed, as indicated by the shortened length of the vertical arrow FS1 in the output signal at the output of the coupler 222.

Notably, the magnitude and/or phase of the first cancellation signal may be adjusted to suppress all of the first fundamental signal, as discussed above, or only a portion of the first fundamental signal. For example, when the first cancellation signal and the first fundamental signal have the same magnitude and are 180 degrees out of phase with one another, the first fundamental signal is completely suppressed. However, when magnitude of the first cancellation signal is less than the magnitude of the first fundamental signal and/or the phase of the first cancellation signal is less than 180 degrees out of phase with the first fundamental signal, then the first fundamental signal is only partially suppressed. Of course, in various embodiments, the level of cancellation may be adjusted as desired.

In alternative embodiments, the first and second cancellation signals may be measured by one receiver, as opposed to separate receivers. For example, the first and second cancellation signals generated by the first and second signal generators 261 and 262, respectively, may be combined, such that they are received by one receiver (e.g., reference receiver 221 via coupler 223). The reference receiver 221 and the controller 250 may then measure and adjust each of the first and second cancellation signals sequentially, as needed. The first and second cancellation signals are then both combined with the output signal at the coupler 223 (eliminating the need for the receiver 241 and the couplers 242 and 243). The magnitudes of the first and second cancellation signals may be slightly higher in order to compensate for the additional combining network prior to the coupler 223.

The output of the coupler 222 is provided to test receiver 225 via another connection at second test port 220 of the VNA 201. Due to the suppressed first and second fundamental signals, the test receiver 225 is linearized and is able to accurately measure IMD products and other distortion in the output signal. Attenuator 226 is shown in the signal path between the coupler 222 and the test receiver 225, in case attenuation is desired. However, in accordance with the various embodiments, the attenuator 226 generally would not be required for enabling measurement of the IMD products and other distortion, and thus may be bypassed or adjusted to a low or minimum setting.

As discussed above, the suppressed first and second fundamental signals reduce the total power at the test receiver 225, which reduces IMD products generated by the test receiver 225. Accordingly, a lower (or no) attenuation value may be provided by the attenuator 226, as mentioned above, improving the noise floor of the test receiver 225. That is, the noise floor remains well below the IMD products in the output signal and therefore does not interfere with the measurements. Also, the test receiver 225 may use a wider IF bandwidth, which enables the test receiver 225 to measure the IMD products more quickly, while maintaining the same sensitivity. Due to the relatively small differences in magnitude among the IMD products and the first and second fundamental signals, the dynamic range of the test receiver 225 is effectively increased. In addition to "removing attenuation" after suppressing the fundamentals at the test receiver 225, various embodiments may include an internal or external low-noise amplifier (LNA) (not shown) to further reduce the noise figure by "adding gain" to the test receiver 225.

The couplers 222, 223, 232, 242 and 243 may be directional couplers, for example, although other devices for removing and/or combining various signals may be incorporated without departing from the scope of the present teachings. Further, although described in a particular order, it is understood that the measurements performed by the reference receivers 221 and 241 and the test receiver 231 may be performed in any order or substantially simultaneously.

Alternative embodiments provide a more "open loop" approach, in which the first and second cancelation signals are not measured prior to application to the test receiver 225, eliminating the need for the test receiver 231 and the reference receivers 221 and 222. That is, the first and second cancellation signals are combined with the output signal at the coupler 222, and measured and/or adjusted by the test receiver 225 (and the controller 250). The phase and magnitude of the output signal may then be adjusted until the levels of the first and second fundamental signals are sufficient minimized. In this approach, only the reference receiver 211 and the test receiver 225 are needed in order to measure the stimulus signal input to the DUT 205 and the output signal output by the DUT 205, respectively. Further, to the extent measurement of the input signal is not needed, cancellation of the one or more fundamental signals may be obtained using the test receiver 225.

Figure 3A:
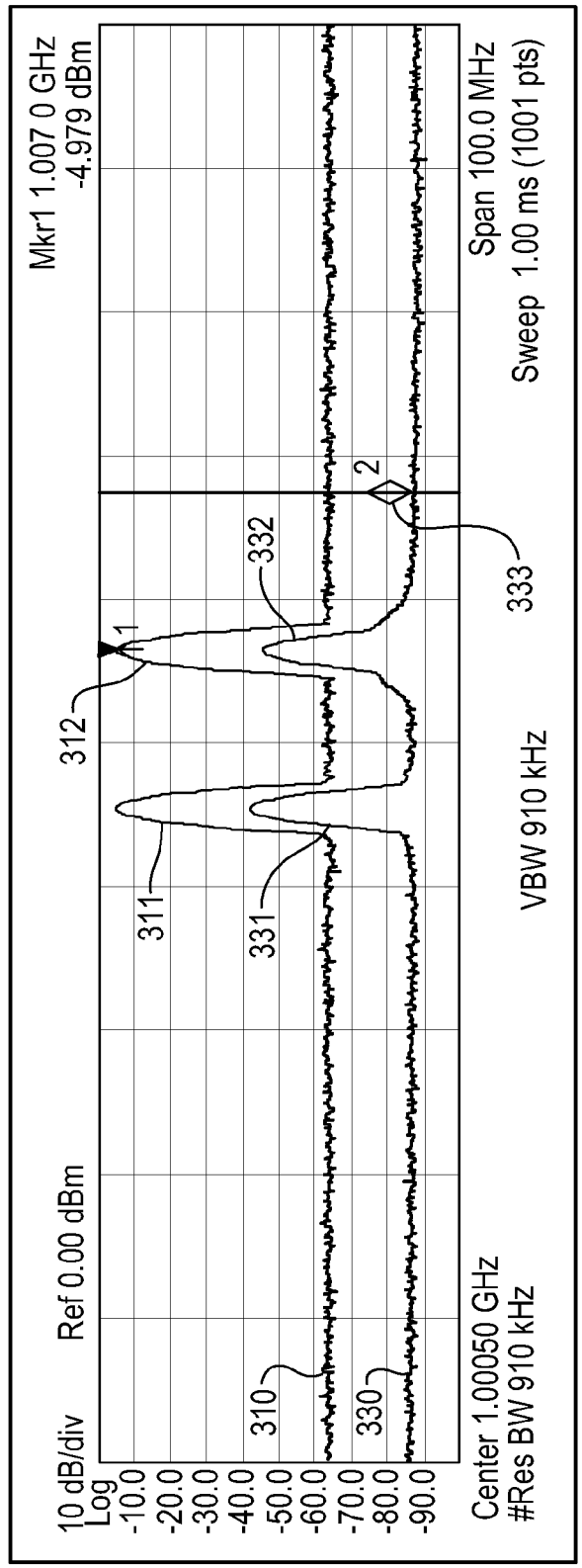
FIG. 3 is a display showing illustrative traces of a received output signal, including first and second fundamental signals, for which distortion products are measured, according to a representative embodiment.
Figure 3B:
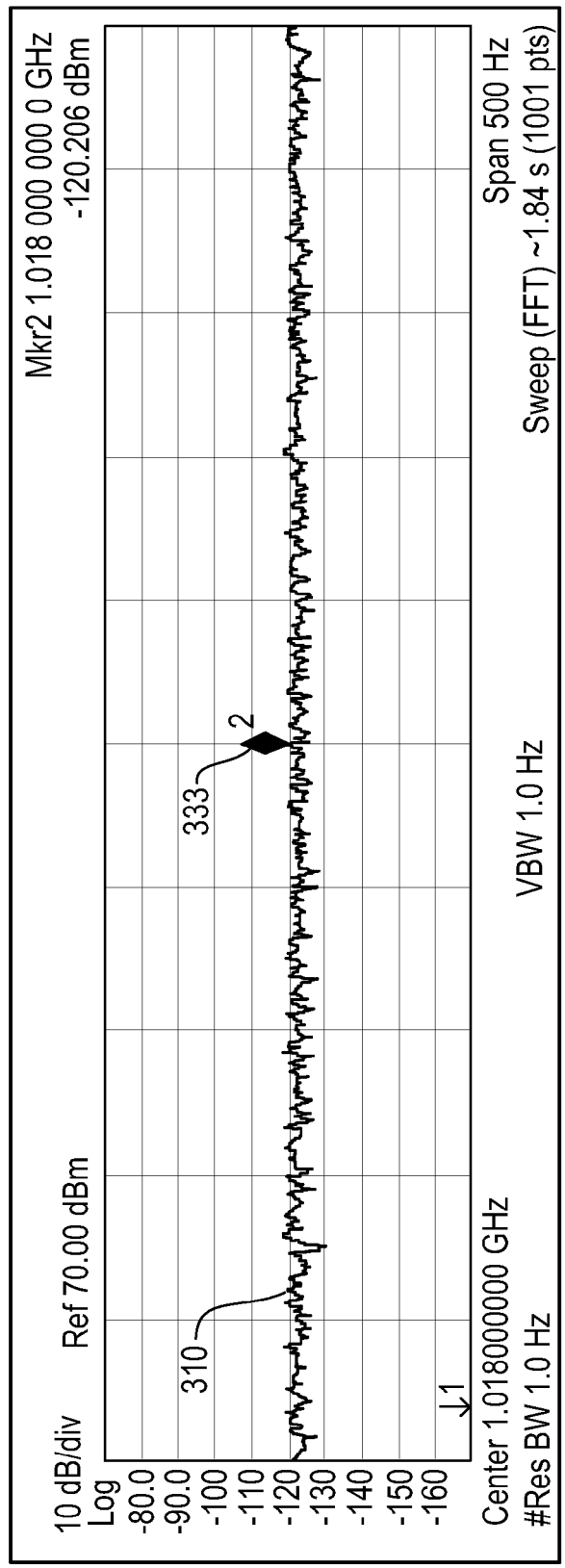
Figure 3C:
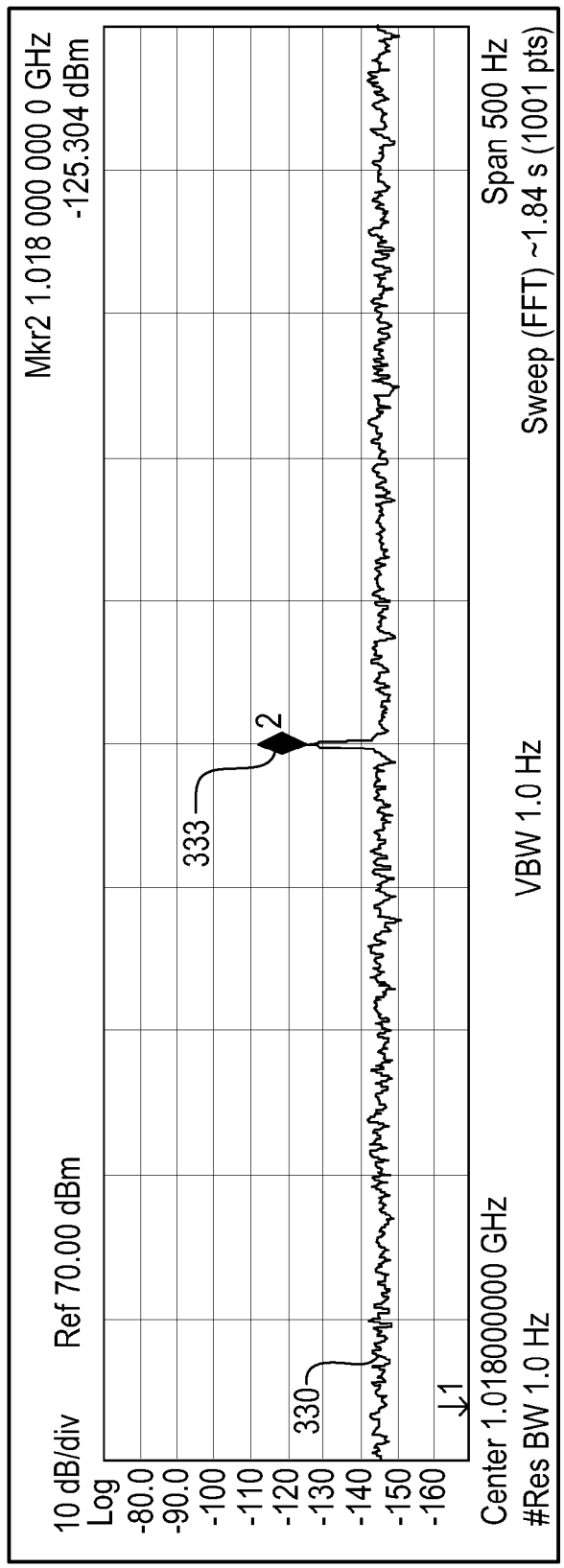

FIGS. 3A-3C are displays showing illustrative traces of a received output signal, including first and second fundamental signals, for which distortion products are measured at a receiver, according to a representative embodiment. In the depicted example, the display in FIG. 3A shows a broad view with 910 kHz resolution bandwidth (RBW), and the displays in FIGS. 3B and 3C show magnified or "zoomed-in" views of an IMD product (333) at Marker 2 with 1-Hz RBW.

Referring to FIG. 3A, trace 310 represents an output signal received by a receiver (e.g., test receiver 225 in FIG. 2), in which no suppression (no nulling) of first and second fundamental signals 311 and 312 has been performed. In the depicted example, the first fundamental signal 311 has a first frequency f1 of about 994 GHz and the second fundamental signal 312 has a second frequency f2 of about 1001 GHz. Due to the amount of power at the receiver, the output signal has been attenuated by about 40 dB and the IF bandwidth has been set relatively narrow at about 1 Hz. In this configuration, the noise floor of the receiver is at about −120 dBm/Hz, while the peaks of the first and second fundamental signals 311 and 312 are at about −5 dBm.

FIG. 3B shows the zoomed-in view of the portion of the spectrum of trace 310 that includes the IMD product 333. Since about 40 dB of attenuation was required, IMD product 333 at Marker 2 is not visible due to the high noise figure of the receiver (from attenuation). That is, the IMD product 333 (present at about 2*f2−f1) is indiscernible in relation to the noise floor of the receiver, in that it is at or below the noise floor, and therefore cannot be accurately measured.

In comparison, trace 330 in FIG. 3A represents the output signal received by the receiver (e.g., test receiver 225 in FIG. 2), in which the first and second fundamental signals 331 and 332 have been suppressed, according to representative embodiments. Again, in the depicted example, the first fundamental signal 331 has a first frequency f1 of about 994 GHz and the second fundamental signal 332 has a second frequency f2 of about 1001 GHz. However, due to the suppression of the first and second fundamental signals 331 and 332, 30 dB of attenuation can be removed and thus the noise floor of the receiver has dropped about 20 dB to about −145 dBm/Hz, while the peaks of the first and second fundamental signals 331 and 332 are only at about −45 dBm.

FIG. 3C shows the zoomed-in view of the portion of the spectrum of trace 330 that includes the IMD product 333. Since the first and second fundamental signals 331 and 332 have been suppressed by about 40 dB, about 30 dB of attenuation may be removed from the receiver input without causing any receiver IMD products. Further, IMD product 333 (present at about 2*f2−f1) is unmasked, and thus distinctly visible over the noise floor with a signal-to-noise ratio of about 20 dB. Accordingly, the IMD product 333 can be accurately measured, e.g., without further attenuation of the receiver, reducing uncertainty and measurement variation. The reason the noise floor appears higher in the trace 310 is because it is measured with a wider RBW of 910 kHz, while the trace 330 shows the noise floor measured with a 1 Hz RBW, to which the noise displayed average noise level (DANL) is usually normalized.

Notably, trace 330 in FIG. 3C does not show the noise floor of the receiver, but rather the sum of phase noise from all four signal sources (e.g., first and second signal sources 207 and 208 and first and second signal generators 261 and 262 in FIG. 2). Therefore, better (less noisy) signal sources improve dynamic range. Further, due to the improved sensitivity of the receiver resulting from 30 dB less attenuation, the IF bandwidth may be broadened, e.g., from about 1 Hz to about 1 kHz. This enables faster measurements of the IMD products without degrading the original sensitivity (i.e., when the 30 dB attenuation was present), including the IMD product 333.

In practice, the gain in receiver sensitivity from reducing attenuation may be traded for a gain in speed. For example, the same measurement made with 40 dB attenuation and a 1 Hz IFBW may be made in accordance with various embodiments to obtain the same sensitivity, but much faster (e.g., up to about thousand times faster) with 10 dB attenuation and a 1 kHz IFBW.

As mentioned above, the measured output signals may have more or fewer than two fundamental signals. Also, in various implementations, fewer than all of the fundamental signals may be suppressed, without departing from the scope of the present teachings. For example, only one of two fundamental signals may be suppressed, in which case only one fundamental signal is present at the receiver. Because the other fundamental signal has been sufficiently suppressed, there is no other larger signal to "mix" with the remaining fundamental signal to produce a receiver-generated IMD product of consequence. Accordingly, remaining IMD product(s) may be measured using a simplified and less expensive system, requiring fewer sources. It is advantageous to cancel the fundamental signal closest to the IMD product of interest. Although the remaining fundamental signal may potentially compress the receiver, which would yield inaccurate amplitude measurements, the compression point is still well above the point at which receiver IMD products in a conventional measurement would become problematic.

Figure 4:
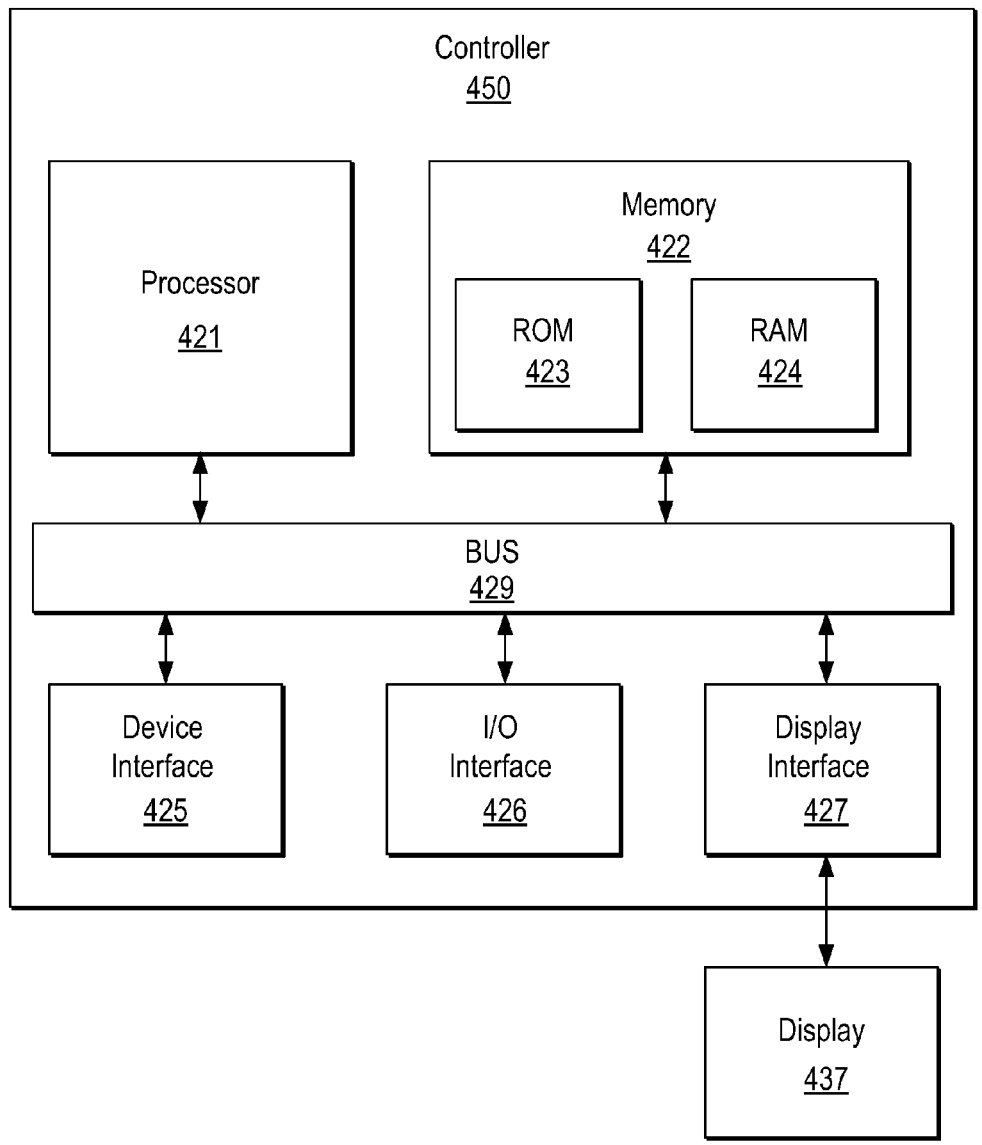
FIG. 4 is a functional block diagram showing an illustrative computer system for implementing emulation of a radio scene, according to a representative embodiment.

FIG. 4 is a functional block diagram showing an illustrative controller 450 that executes all or a portion of a process for measuring distortion in a signal output by a DUT, according to a representative embodiment. The controller 450 may perform the various functions of the controller 250, discussed above with reference to FIG. 2, for example. The various "parts" shown in the controller 450 may be physically implemented using a software-controlled microprocessor, e.g., processor 421, hard-wired logic circuits, firmware, or a combination thereof. Also, while the parts are functionally segregated in the controller 450 for explanation purposes, they may be combined variously in any physical implementation.

In the depicted embodiment, the controller 450 includes processor 421, memory 422, bus 429 and various interfaces 425-427. The processor 421 method for measuring distortion of a described herein (e.g., including the various operations of FIG. 1), in conjunction with the memory 422. The processor 421 may be constructed of any combination of hardware, firmware or software architectures, and include its own memory (e.g., nonvolatile memory) for storing executable software/firmware executable code that allows it to perform the various functions. Alternatively, the executable code may be stored in designated memory locations within memory 422, discussed below. In an embodiment, the processor 421 may be a central processing unit (CPU), for example, executing an operating system, which may also control execution of other programs of the controller 450.

The memory 422 may be any number, type and combination of nonvolatile read only memory (ROM) 423 and volatile random access memory (RAM) 424, and stores various types of information, such as computer programs and software algorithms executable by the processor 421 (and/or other components), e.g., to perform location determination processes of the embodiments described herein. As generally indicated by ROM 423 and RAM 424, the memory 422 may include any number, type and combination of tangible computer readable storage media, such as disk drive, an electrically programmable read-only memory (EPROM), an electrically erasable and programmable read only memory (EEPROM), a CD, a DVD, a universal serial bus (USB) drive, and the like. Further, the memory 422 may store the predetermined boundaries one or more enterprise networks, as discussed above.

In an embodiment, a user (and/or other computers) may interact with the controller 450 using various input device(s) through I/O interface 426. The input devices may include a keyboard, key pad, a track ball, a mouse, a touch pad or touch-sensitive display, and the like. Also, various information may be displayed on a display 437 through display interface 427. Further, the controller 450 may interface with and otherwise control various external devices, such as representative first and second signal generators 261 and 262 of FIG. 2, through device interface 425, which communicate with the processor 421 and/or the memory 422 via bus 429.

According to various embodiments, amplitude of the cancellation signals may be controlled to within a few hundredths of a decibel, as opposed to −0.25 dB increments in accordance with conventional techniques. Also, phase of the cancellation signals may be controlled to within a degree. Thus, the VNA 201 is able to measure/set the magnitude and phase of cancellation signals with a high degree of accuracy, even at low signal levels, because of its variable IF bandwidth. Also, since the magnitude and phase changes of the linearizing sources (e.g., first and second signal generators 261 and 262) are performed electronically and may be automated, the measurement process is performed quickly with no user intervention.

Further, the various embodiments may be used over the entire frequency range supported by the VNA 201 and/or extra source(s) (e.g., all sources may be internal to the VNA 201 in various embodiments), which is currently about 10 MHz to about 67 GHz. In contrast, conventional techniques would require many filters to cover this large of a frequency range, and phase delay lines would be very long at low frequencies.

Generally, the system is compact and consists only of a VNA and possibly one or more external sources, if needed. All of the signal routing and combining can be achieved simply by reconfiguring front-panel and rear-panel jumpers of the VNA, so setup is easier than the external filters, line stretchers, attenuators, etc., needed for conventional techniques.

For some DUTs or for wide spacing of fundamental signals, each fundamental signal at the output of the DUT may experience different gain or phase delay through the DUT, or the group delay of the DUT may not be constant over the entire bandwidth of the input signal (tone spacing). However, the various embodiments treat each fundamental signal individually, so regardless of gain and/or phase flatness of the DUT, one or both of the fundamental signals may be canceled optimally with the additional linearizing source(s).

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A system having an extended dynamic range for measuring distortion in an output signal of a device under test (DUT), the output signal having at least a first fundamental signal, the system comprising:
    a first coupler configured to inject a first cancellation signal generated by a first signal source into the output signal from the DUT, at least one of a first magnitude and a first phase of the first cancellation signal being adjustable for suppressing the first fundamental signal;
    a test receiver configured to receive and measure the output signal having the suppressed first fundamental signal;
    another test receiver configured to receive the output signal from the DUT and to measure the magnitude and the phase of the first fundamental signal; and
    a first reference receiver configured to measure the first magnitude and the first phase of the first cancellation signal,
    wherein the first signal source is adjustable based on the measured first magnitude and the measured first phase to provide the first cancellation signal having the first magnitude substantially equal to the measured magnitude of the first fundamental signal and the first phase approximately 180 degrees out of phase with the measured phase of the first fundamental signal.

2. The system of claim 1, further comprising:
    a second coupler configured to inject a second cancellation signal generated by a second signal source into the output signal from the DUT, at least one of a second magnitude and a second phase of the second cancellation signal being adjustable for suppressing a second fundamental signal.

3. The system of claim 2, further comprising:
    a second reference receiver configured to measure the second magnitude and the second phase of the second cancellation signal,
    wherein the second signal source is adjustable based on a measured second magnitude and a measured second phase to provide the second cancellation signal having the second magnitude approximately equal to the measured magnitude of the second fundamental signal and the second phase approximately 180 degrees out of phase with the measured phase of the second fundamental signal.

4. The system of claim 3, further comprising:
    a third signal source configured to generate the first fundamental signal for a stimulus signal; and
    a fourth signal source configured to generate the second fundamental signal for the stimulus signal, wherein the stimulus signal is input to the DUT such that the output signal indicates a response of the DUT to the stimulus signal.

5. The system of claim 4, wherein the test receivers, the first and second reference receivers, the first and second couplers, and the third and fourth signal sources are internal to a network analyzer.

6. The system of claim 5, wherein the first and second signal sources are external signal sources connected to the network analyzer.

7. The system of claim 1, wherein the first cancellation signal comprises a continuous wave signal.

8. The system of claim 1, wherein the first cancellation signal comprises a pulsed signal.

9. The system of claim 1, wherein the first cancellation signal comprises a modulated signal.

10. The system of claim 1, wherein the test receiver is configured to measure at least one distortion property of the DUT using the received output signal.

11. The system of claim 10, wherein the at least one measured distortion property comprises at least one intermodulation distortion (IMD) product.

12. A system having an extended dynamic range for measuring distortion in an output signal of a device under test (DUT), the system comprising:
   at least one stimulus signal source configured to generate a stimulus signal including a first fundamental signal at a first frequency and second fundamental signal at a second frequency, the stimulus signal being input to the DUT such that the output signal indicates a response of the DUT to the stimulus signal;
   a first coupler configured to inject a first cancellation signal generated by a first signal generator into the output signal from the DUT, at least one of a first magnitude and a first phase of the first cancellation signal being adjustable for suppressing the first fundamental signal in the output signal from the DUT;
   a second coupler configured to inject a second cancellation signal generated by a second signal generator into the output signal from the DUT, at least one of a second magnitude and a second phase of the second cancellation signal being adjustable for suppressing the second fundamental signal;
   a test receiver configured to receive and measure the output signal having the suppressed first fundamental signal;
   a first reference receiver configured to measure the first magnitude and the first phase of the first cancellation signal; and
   a second reference receiver configured to measure the second magnitude and the second phase of the second cancellation signal;
   wherein the first signal generator is adjustable based on the measured first magnitude and the measured first phase to provide the first cancellation signal having the first magnitude substantially equal to the measured magnitude of the first fundamental signal and the first phase approximately 180 degrees out of phase with the measured phase of the first fundamental signal, and
   wherein the second signal generator is adjustable based on the measured second magnitude and the measured second phase to provide the second cancellation signal having the second magnitude substantially equal to the measured magnitude of the second fundamental signal and the second phase approximately 180 degrees out of phase with the measured phase of the second fundamental signal.

13. The system of claim 12 wherein the test receiver is configured to measure at least one distortion property of the DUT using the received output signal.

14. The system of claim 13, wherein the at least one measured distortion property comprises at least one intermodulation distortion (IMD) product.

15. The system of claim 12, wherein the first cancellation signal comprises a continuous wave signal.

16. The system of claim 12, wherein the first cancellation signal comprises a pulsed signal.

17. The system of claim 12, wherein the first cancellation signal comprises a modulated signal.

* * * * *